(12) United States Patent
Regau et al.

(10) Patent No.: US 10,068,958 B2
(45) Date of Patent: Sep. 4, 2018

(54) ORGANIC LIGHT-EMITTING COMPONENT AND METHOD FOR PRODUCING AN ORGANIC LIGHT-EMITTING COMPONENT

(71) Applicant: OSRAM OLED GmbH, Regensburg (DE)

(72) Inventors: Kilian Regau, Regensburg (DE); Karsten Diekmann, Rattenberg (DE); Egbert Hoefling, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 192 days.

(21) Appl. No.: 15/120,151

(22) PCT Filed: Feb. 20, 2015

(86) PCT No.: PCT/EP2015/053613
§ 371 (c)(1),
(2) Date: Aug. 19, 2016

(87) PCT Pub. No.: WO2015/124723
PCT Pub. Date: Aug. 27, 2015

(65) Prior Publication Data
US 2017/0077206 A1 Mar. 16, 2017

(30) Foreign Application Priority Data
Feb. 21, 2014 (DE) .................. 10 2014 102 255

(51) Int. Cl.
*H01L 27/32* (2006.01)
*H01L 51/52* (2006.01)
(Continued)

(52) U.S. Cl.
CPC ...... *H01L 27/3276* (2013.01); *H01L 51/0021* (2013.01); *H01L 51/5203* (2013.01);
(Continued)

(58) Field of Classification Search
CPC ............. H01L 27/3276; H01L 51/0021; H01L 51/5203; H01L 51/5225; H01L 51/56; H01L 2251/5361; H01L 2251/5392
See application file for complete search history.

(56) References Cited

U.S. PATENT DOCUMENTS 8,759,884 B2 * 6/2014 Brand ................. H01L 27/3202
174/250
9,166,188 B1 * 10/2015 Chang ................. H01L 51/0097
(Continued)

FOREIGN PATENT DOCUMENTS

DE 102006055884 A1 4/2008
DE 102006060781 A1 4/2008
(Continued)

OTHER PUBLICATIONS

International Search Report based on Application No. PCT/EP20151053613 (3 pages and 2 pages of English ranslation) dated Jun. 18, 2015 (Reference Purpose Only).
(Continued)

*Primary Examiner* — Peter Bradford
(74) *Attorney, Agent, or Firm* — Viering Jentschura & Partner MBB (57) ABSTRACT

In various embodiments, an organic light-emitting organic is provided. The organic light-emitting component may include a first electrode layer, an organic functional layer structure over the first electrode layer, and a second electrode layer over the organic functional layer structure. The second electrode layer and the organic functional layer structure are divided into subregions which are arranged laterally next to one another, which are respectively at least partially separated from one another. A plurality of the subregions are electrically connected to at least two neighboring subregions by at least two corresponding connecting
(Continued)

elements with are formed by the second electrode layer and the organic functional layer structure.

13 Claims, 5 Drawing Sheets

(51) Int. Cl.
    *H01L 51/00*     (2006.01)
    *H01L 51/56*     (2006.01)

(52) U.S. Cl.
    CPC .......... *H01L 51/5225* (2013.01); *H01L 51/56* (2013.01); *H01L 2251/5361* (2013.01); *H01L 2251/5392* (2013.01)

(56) References Cited

U.S. PATENT DOCUMENTS

| | | | |
|---|---|---|---|
| 2006/0043406 A1* | 3/2006 | Tsubokura | G02F 1/133603 257/99 |
| 2007/0273276 A1* | 11/2007 | Ottermann | H01L 51/0005 313/505 |
| 2010/0007269 A1 | 1/2010 | Klein et al. | |
| 2011/0062603 A1 | 3/2011 | Hawker et al. | |
| 2012/0091923 A1* | 4/2012 | Kastner-Jung | F21S 10/02 315/360 |

FOREIGN PATENT DOCUMENTS

| | | |
|---|---|---|
| EP | 2363905 A1 | 9/2011 |
| JP | 2001319778 A | 11/2001 |
| WO | 2008099315 A2 | 8/2008 |

OTHER PUBLICATIONS

German Search Report based on Application No. 10 2014 102 255.6(7 Pages) dated Feb. 6, 2015.

* cited by examiner

ORGANIC LIGHT-EMITTING COMPONENT AND METHOD FOR PRODUCING AN ORGANIC LIGHT-EMITTING COMPONENT

RELATED APPLICATIONS

The present application is a national stage entry according to 35 U.S.C. § 371 of PCT application No.: PCT/EP2015/053613 filed on Feb. 20, 2015, which claims priority from German application No.: 10 2014 102 255.6 filed on Feb. 21, 2014, and is incorporated herein by reference in its entirety.

TECHNICAL FIELD

Various embodiments may relate to an organic light-emitting component and to a method for producing an organic light-emitting component.

BACKGROUND

Organic-based light-emitting components, for example organic light-emitting diodes (OLEDs), are being used increasingly widely in general lighting, for example as a flat light source.

An organic light-emitting component, for example an OLED, may include an anode and a cathode with an organic functional layer system between them. The organic functional layer system may include one or more emitter layers, in which electromagnetic radiation is generated, a charge carrier pair generation layer structure having two or more charge carrier pair generation layers ("charge generating layer", CGL) for charge carrier pair generation, and one or more electron barrier layers, also referred to as hole transport layer(s) (HTL), and one or more hole barrier layers, also referred to as electron transport layer(s) (ETL), in order to direct the flow of current.

The trend in OLEDs is tending toward ever-larger components, with correspondingly ever-larger luminous surfaces. However, the problem of OLEDs failing spontaneously by an internal short circuit increases with the size of the OLED surface. The reason for this may be minute particles that may be included between the substrate and the cover glass during the manufacture of the OLED, which may penetrate through the organic layers and cause a short circuit. Such potential short circuits cannot always be detected reliably during the component test, and accordingly the corresponding components cannot always be detected and rejected, which can lead to failures.

One measure for filtering out components potentially at risk is a cost-intensive test method, which has to be carried out individually for each OLED before delivery to the customer.

SUMMARY

In various embodiments, an organic light-emitting component is provided, which can be operated reliably and/or which can continue to be operated in the event of a short circuit occurring in an active region of the organic light-emitting component.

In various embodiments, a method for producing an organic light-emitting component is provided, which can be carried out simply and/or economically and/or which contributes to the organic light-emitting component being operable reliably and/or still being operable if a short circuit occurs in an active region of the organic light-emitting component.

In various embodiments, an organic light-emitting component is provided. The organic light-emitting component includes a first electrode layer, an organic functional layer structure over the first electrode layer, and a second electrode layer over the organic functional layer structure. The second electrode layer and the organic functional layer structure are divided into subregions which are arranged laterally next to one another, which are respectively at least partially separated from one another. A plurality of the subregions are electrically connected to at least two neighboring subregions by at least two corresponding connecting elements which are formed by the second electrode layer and the organic functional layer structure.

In other words, the second electrode layer and the organic functional layer structure are structured into subregions separated from one another substantially, i.e. apart from the connecting elements. By the subregions, a plurality of OLED elements are formed, which are relatively small in relation to the overall organic light-emitting component. In particular, the first electrode layer, one of the subregions of the organic functional layer structure which lie directly thereover, in particular vertically thereover, and the corresponding subregion of the second electrode layer, form one of these OLED elements. The lateral direction extends parallel to planes in which the individual layers lie and/or extend. The vertical direction is perpendicular to the lateral direction and is therefore perpendicular to the planes in which the layers lie and/or extend.

The structuring of the second electrode layer and of the organic functional layer structure into the subregions which are partially separated from one another and the connection of the subregions with one another respectively to at least two other of the subregions contribute to the organic light-emitting component being operable reliably and/or still being operable if a short circuit occurs in an active region of the organic light-emitting component, particularly in an active region of the corresponding OLED element, outside the corresponding OLED element, i.e. in the other OLED elements.

The subregions, and therefore the small OLED elements, are electrically connected to one another by the connecting elements formed by the second electrode layer and the organic functional layer structure, the connecting elements acting as electrical fuses between the corresponding OLED elements. In other regards, the subregions are separated from one another, in particular electrically insulated from one another. If a short circuit occurs in one of the small OLED elements, then the connecting elements are separated and/or removed, for example by partial or full melting. In this way, the corresponding OLED element, and in particular the short circuit in the corresponding OLED element is electrically insulated from the other OLED elements. The effect of this is that only a very small region of the organic light-emitting component becomes nonluminous, in particular the OLED element with the short circuit. This may be manifested as a small nonluminous point in the light pattern of the organic light-emitting component. The nonluminous point may, however, be so small that it can be neglected and/or it is not visible to the naked eye. The organic light-emitting component, and in particular the other OLED elements of the organic light-emitting component can continue to be used and generate light.

Optionally, in order to blur out the failure of individual OLED elements, a scattering layer, for example an integrated scattering layer and/or an external output coupling film, may be formed and/or arranged. Because of the scattering layer, a nonluminous OLED element is then inconspicuous, or only negligibly conspicuous, since the small nonluminous point is blurred out in the light pattern by the scattering.

The electrical insulation of the short circuit also counteracts a heating effect in the damaged organic light-emitting component, which can contribute to great security during the operation of the organic light-emitting component and may be technically advantageous in so far as thermal crosstalk no longer occurs, which would otherwise have repercussions on the light pattern of the organic light-emitting component.

Two of the neighboring subregions may be directly connected to one another and/or physically coupled exclusively by one of the connecting elements. As an alternative thereto, two neighboring subregions may be directly connected to one another and/or physically coupled by two or more connecting elements.

In various embodiments, a plurality of the subregions are connected to at least three neighboring subregions by three corresponding connecting elements.

In various embodiments, an organic light-emitting component is provided. The organic light-emitting component includes a first electrode layer, an organic functional layer structure over the first electrode layer, and a second electrode layer, which is formed over the organic functional layer structure.

The second electrode layer is divided into subregions which are arranged laterally next to one another, which are respectively at least partially separated from one another. A plurality of the subregions are electrically connected to at least three neighboring subregions by at least three corresponding connecting elements which are formed by the second electrode layer.

In other words, the second electrode layer is structured into subregions separated from one another substantially, i.e. apart from the connecting elements. By the subregions, a plurality of OLED elements are formed, which are relatively small in relation to the overall organic light-emitting component. In particular, the first electrode layer, the organic functional layer structure, and respectively one of the subregions of the second electrode layer which lie thereover, form one of these OLED elements.

The structuring of the second electrode layer into the subregions partially separated from one another and the connection of the subregions with one another respectively to at least three other of the subregions contribute to the organic light-emitting component being operable reliably and/or still being operable if a short circuit occurs in an active region of the organic light-emitting component, particularly in an active region of the corresponding OLED element, outside the corresponding OLED element, i.e. in the other OLED elements.

The subregions, and therefore the small OLED elements, are electrically connected to one another by the connecting elements formed by the second electrode layer, the connecting elements acting as electrical fuses between the corresponding OLED elements. In other regards, the subregions are separated from one another, in particular electrically insulated from one another. If a short circuit occurs in one of the small OLED elements, then the connecting elements are separated and/or removed, for example by partial or full melting. In this way, the corresponding OLED element, and in particular the short circuit in the corresponding OLED element is electrically insulated from the other OLED elements. The effect of this is that only a very small region of the organic light-emitting component becomes nonluminous, in particular the OLED element with the short circuit. This may be manifested as a small nonluminous point in the light pattern of the organic light-emitting component. The nonluminous point may, however, be so small that it can be neglected and/or it is not visible to the naked eye. The organic light-emitting component, and in particular the other OLED elements of the organic light-emitting component can, however, continue to be used.

Optionally, in order to blur out the failure of individual OLED elements, a scattering layer, for example an integrated scattering layer and/or an external output coupling film, may be formed and/or arranged. Because of the scattering layer, a nonluminous OLED element is then inconspicuous, or only negligibly conspicuous, since the small nonluminous point is blurred out in the light pattern by the scattering.

The electrical insulation of the short circuit also counteracts a heating effect in the damaged organic light-emitting component, which can contribute to great security during the operation of the organic light-emitting component and may be technically advantageous in so far as thermal crosstalk no longer occurs, which would otherwise have repercussions on the light pattern of the organic light-emitting component.

Two of the neighboring subregions may be directly connected to one another and/or physically coupled exclusively by one of the connecting elements. As an alternative thereto, two of the neighboring subregions may be directly connected to one another and/or physically coupled by two or more connecting elements.

In various embodiments, the subregions extend over the organic functional layer structure. In other words, respectively one of the subregions of the second electrode layer and the subregion, lying directly thereunder, of the organic functional layer structure form a common subregion and, in combination with the first electrode layer, one of the OLED elements.

In various embodiments, current distributor elements are arranged over the first electrode layer and at least partially under the organic functional layer structure. The current distributor elements and the subregions are configured and arranged with respect to one another in such a way that separating regions, in which the subregions are separated from one another, are arranged vertically over the current distributor elements. The current distributor elements may be interconnected with one another. In other words, the current distributor elements form a current distributor network. The current distributor elements are electrically connected to the first electrode layer. The current distributor elements may be formed in direct physical contact with the first electrode layer, for example directly on the first electrode layer. The current distributor elements may be electrically and/or physically insulated in the direction toward the organic functional layer structure. For example, an insulator layer may be formed between the current distributor elements and the organic functional layer structure. The current distributor elements may extend essentially in the lateral direction in the organic light-emitting component. The thickness of the current distributor elements extends perpendicularly to the lateral direction, than in a vertical direction. The current distributor elements may also be referred to as "busbars". The current distributor elements are used during operation of the organic light-emitting component in order to distribute the electrical current over the first electrode layer, and therefore to generate a uniform light pattern over the entire luminous surface of the organic light-emitting component.

In various embodiments, the organic light-emitting component includes edge regions which are formed at least by the second electrode layer and which are respectively separated at least partially from one another and from the subregions. A plurality of the subregions are electrically connected to at least one neighboring edge region and to at least one neighboring subregion by two corresponding connecting elements which are formed at least by the second electrode layer. The edge regions are in particular, arranged at the edges of the luminous surface of the organic light-emitting component. For example, the subregions may be enclosed by the edge regions in the lateral direction. The edge regions may be understood as subregions which, because of their position at the edge of the active luminous surface, can have fewer neighboring subregions and therefore also fewer connecting elements.

In various embodiments, the subregions and/or the edge regions are configured in a honeycomb fashion. This can contribute in a straightforward way to particularly effective surface usage.

In various embodiments, a method for producing an organic light-emitting component is provided. In the method, a first electrode layer is formed, an organic functional layer structure is formed over the first electrode layer, and a second electrode layer is formed over the organic functional layer structure. The second electrode layer and the organic functional layer structure are configured in such a way that they are divided into subregions which are arranged laterally next to one another, which are respectively at least partially separated from one another, and that a plurality of the subregions are electrically connected to at least two neighboring subregions by two corresponding connecting elements which are formed by the second electrode layer and the organic functional layer structure.

The subregions, and therefore the structuring of the second electrode layer and of the organic functional layer structure, may for example be formed by a laser and/or a mask technique after deposition of the layers. Structuring by a mask technique can be carried out very favorably. Structuring by a laser can be carried out very precisely. The second electrode layer does not need to be structured elaborately by lithography. The second electrode layer and the organic functional layer structure may be structured by laser cutting in one working step.

In various embodiments, the second electrode layer and the organic functional layer structure are configured in such a way that a plurality of the subregions are connected to at least three neighboring subregions by three corresponding connecting elements.

In various embodiments, a method for producing an organic light-emitting component is provided. In the method, a first electrode layer is formed, an organic functional layer structure is formed over the first electrode layer, and a second electrode layer is formed over the organic functional layer structure in such a way that the second electrode layer is divided into subregions which are arranged laterally next to one another, which are respectively at least partially separated from one another, a plurality of the subregions being electrically connected to at least three neighboring subregions by three corresponding connecting elements which are formed by the second electrode layer.

The subregions, and therefore the structuring of the second electrode layer, may for example be formed by a laser and/or a mask technique after deposition of the layer. Structuring by a mask technique can be carried out very favorably. Structuring by a laser can be carried out very precisely. The second electrode layer does not need to be structured elaborately by lithography.

In various embodiments, the organic functional layer structure is configured in such a way that the subregions extend over the organic functional layer structure.

In various embodiments, current distributor elements are formed over the first electrode layer and at least partially under the organic functional layer structure. The current distributor elements and the subregions are configured and arranged with respect to one another in such a way that separating regions, in which the subregions are separated from one another, are arranged vertically over the current distributor elements. After formation of the current distributor elements and before formation of the functional layer structure, the insulator layer may be formed over the current distributor elements in order to electrically insulate the current distributor elements from the organic functional layer structure.

In various embodiments, at least the second electrode layer is configured in such a way that it includes edge regions which are respectively separated at least partially from one another, a plurality of the subregions being electrically connected to at least one neighboring edge region and to at least one neighboring subregion by respectively at least one corresponding connecting element which is formed at least by the first electrode layer.

In various embodiments, the second electrode layer and/or the organic functional layer structure are initially formed surface-wide over the first electrode layer. The subregions and/or the edge regions are subsequently formed by correspondingly cutting through the second electrode layer and/or the organic functional layer structure by a laser except for the connecting elements. The subregions, the OLED elements and, in particular, the connecting elements can be produced very accurately and with very fine structures by the laser cutting method. By the laser method, the structures can be shaped in any desired way and optimized.

In various embodiments, the current distributor elements are used as a laser stop. For example, the second electrode layer and the organic functional layer structure are cut directly above and/or vertically over the current distributor elements by the laser, and the laser is adjusted in such a way that it cuts through the second electrode layer and the organic functional layer structure only, and not the current distributor elements. The width of the separating regions may correspond to the width of the laser cut. The length of the connecting elements may correspond to the width of the laser cut.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the appended drawings which form part of this description and in which specific embodiments in which the invention can be carried out are shown for illustration. In this regard, direction terminology such as "up", "down", "forward", "backward", "front", "rear", etc. is used with reference to the orientation of the figure or figures being described. Since constituent parts of embodiments can be positioned in a number of different orientations, the direction terminology is used for illustration and is in no way restrictive. It is to be understood that other embodiments may be used and structural or logical modifications may be carried out, without departing from the protective scope of the present invention. It is to be understood that the features of the various embodiments described herein may be combined with one another, unless specifically indicated otherwise. The following detailed description is therefore not to be interpreted in a restrictive sense, and the protective scope of the present invention is defined by the appended claims.

In the scope of this description, terms such as "connected" or "coupled" are used to describe both direct and indirect connection, and direct or indirect coupling. In the figures, elements which are identical or similar are provided with identical references, insofar as this is expedient.

An organic light-emitting component may in various embodiments be an organic light-emitting semiconductor component, and/or configured as an organic light-emitting diode (OLED) or as an organic light-emitting transistor. The radiation may for example be light in the visible range, UV light and/or infrared light. The organic light-emitting component may in various embodiments be part of an integrated circuit. Furthermore, a multiplicity of organic light-emitting components may be provided, for example fitted in a common housing.

Figure 1:
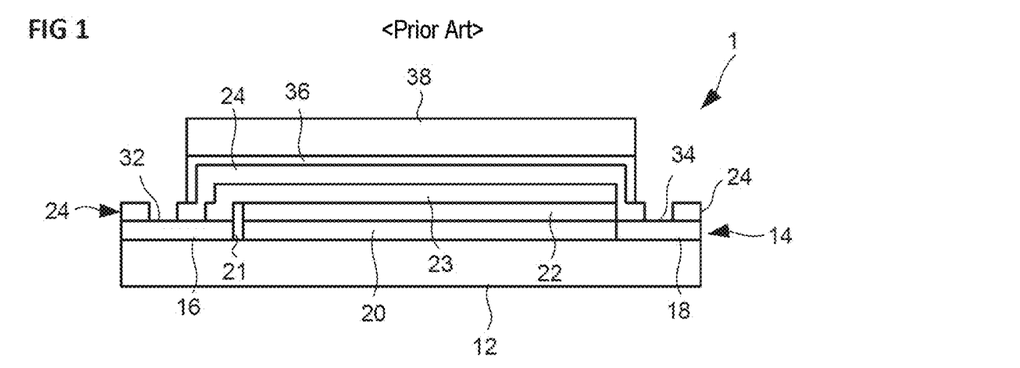
FIG. 1 shows a lateral sectional representation of an organic light-emitting component according to the related art.

FIG. 1 shows a conventional organic light-emitting component 1. The conventional organic light-emitting component 1 includes a carrier 12. An optoelectronic layer structure is formed on the carrier 12.

The optoelectronic layer structure includes a first electrode layer 14, which includes a first contact section 16, a second contact section 18 and a first electrode 20. The second contact section 18 is electrically coupled to the first electrode 20 of the optoelectronic layer structure. The first electrode 20 is electrically insulated from the first contact section 16 by an electrical insulation barrier 21. An organic functional layer structure 22 of the optoelectronic layer structure is formed over the first electrode 20. The organic functional layer structure 22 may for example include one, two or more sublayers. A second electrode 23 of the optoelectronic layer structure, which is electrically coupled to the first contact section 16, is formed over the organic functional layer structure 22. The first electrode 20 is used as an anode of the optoelectronic layer structure. The second electrode 23 forms a second electrode, which is used as a cathode of the optoelectronic layer structure.

An encapsulation layer 24 of the optoelectronic layer structure, which encapsulates the optoelectronic layer structure, is formed over the second electrode 23 and partially over the first contact section 16 and partially over the second contact section 18. In the encapsulation layer 24, a first recess of the encapsulation layer 24 is formed over the first contact section 16 and a second recess of the encapsulation layer 24 is formed over the second contact section 18. A first contact region 32 is exposed in the first recess of the encapsulation layer 24, and a second contact region 34 is exposed in the second recess of the encapsulation layer 24. The first contact region 32 is used for electrical contacting of the first contact section 16, and the second contact region 34 is used for electrical contacting of the second contact section 18.

A bonding layer 36 is formed over the encapsulation layer 24. The bonding layer 36 includes for example a bonding agent, for example an adhesive, for example a laminating adhesive, a coating and/or a resin. A cover body 38 is formed over the bonding layer 36.

If, during a method for producing the conventional organic light-emitting component 1, a particle comes between the second electrode layer 23 and the cover body 38, for example between the encapsulation layer 24 and the cover body 38, or between the second electrode layer 23 and the first electrode layer 20, for example between the first electrode layer 20 and the organic functional layer structure 22 or between the organic functional layer structure 22 and the second electrode layer 23, then for example because of internal stresses or external pressure it may be pressed through the second electrode layer 23 and the organic functional layer structure 22 as far as the first electrode layer 20 and cause a short circuit between the first electrode layer 20 and the second electrode layer 23. This may lead to failure of the conventional organic light-emitting component 1.

Figure 2:
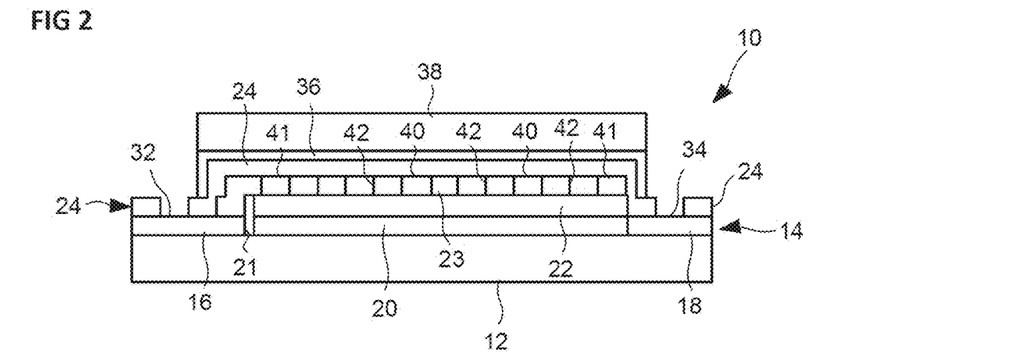
FIG. 2 shows a lateral sectional representation of an embodiment of an organic light-emitting component.

FIG. 2 shows an embodiment of an organic light-emitting component 10. The organic light-emitting component 10 includes a carrier 12. An optoelectronic layer structure is formed on the carrier 12.

The optoelectronic layer structure includes a first electrode layer 14, which includes a first contact section 16, a second contact section 18 and a first electrode 20. The carrier 12 and the first electrode layer 14 may also be referred to as a substrate. The second contact section 18 coupled to the first electrode 20 of the optoelectronic layer structure. The first electrode 20 is electrically insulated from the first contact section 16 by an electrical insulation barrier 21. An organic functional layer structure 22 of the optoelectronic layer structure is formed over the first electrode 20. The organic functional layer structure 22 may for example include one, two or more sublayers, which will be explained in more detail below with reference to FIG. 11.

A second electrode layer 23, which is electrically connected to the first contact section 16, of the optoelectronic layer structure is formed over the organic functional layer structure 22. The second electrode layer 23 includes a plurality of subregions 40 and a plurality of edge regions 41, which are physically and electrically separated, i.e. electrically insulated, from one another in separating regions 42, although they are electrically connected to one another by connecting elements 48 not represented in FIG. 2 (see FIGS. 7 to 10). The connecting elements 48 may be formed by the second electrode layer 23. The subregions 40, the edge regions 41 and connecting elements 48 are therefore electrically connected to one another outside the separating regions 42 and may be formed by the second electrode layer 23. The subregions 40 and edge regions 41 therefore form small second electrodes of the second electrode layer 23, which are electrically insulated from one another in the separating regions 42 and are electrically connected to one another by the connecting elements 48.

The edge regions 41 lie next to the subregions 40 in the lateral direction. For example, the edge regions 41 may form an edge of the subregions 40. The edge regions 41 may also be referred to as subregions lying at the edge.

The first electrode layer 14, the organic functional layer structure 22 and the subregions 40, or the edge regions 41, in particular the second electrodes, form a multiplicity of small OLED elements. For example, each subregion 40 and each edge region 41 respectively characterize an OLED element of the organic light-emitting component 10.

The first electrode 20 is used, for example, as an anode or cathode of the optoelectronic layer structure. The second electrode layer 23 is used, in a manner corresponding to the first electrode, as a cathode or anode of the optoelectronic layer structure.

An encapsulation layer 24 of the optoelectronic layer structure, which encapsulates the optoelectronic layer structure, is formed over the second electrode 23 and partially over the first contact section 16 and partially over the second contact section 18. In the encapsulation layer 24, a first recess of the encapsulation layer 24 is formed over the first contact section 16 and a second recess of the encapsulation layer 24 is formed over the second contact section 18. A first contact region 32 is exposed in the first recess of the encapsulation layer 24, and a second contact region 34 is exposed in the second recess of the encapsulation layer 24. The first contact region 32 is used for electrical contacting of the first contact section 16, and the second contact region 34 is used for electrical contacting of the second contact section 18.

A bonding layer 36 is formed over the encapsulation layer 24. The bonding layer 36 includes for example a bonding agent, for example an adhesive, for example a laminating adhesive, a coating and/or a resin. A cover body 38 is formed over the bonding layer 36. The bonding layer 36 is used for fastening the cover body 38 on the encapsulation layer 24. The cover body 38 includes, for example, glass and/or metal. For example, the cover body 38 may be formed essentially from glass and include a thin metal layer, for example a metal foil, and/or a graphite layer, for example a graphite laminate, on the glass body. The cover body 38 is used to protect the organic light-emitting component 10, for example, against the effects of mechanical force from the outside. Furthermore, the cover body 38 may be used to distribute and/or dissipate heat which is generated in the organic light-emitting component 10. For example, the glass of the cover body 38 may be used as protection against external influences, and the metal layer of the cover body 38 may be used to distribute and/or dissipate the heat given off during operation of the organic light-emitting component 10.

If, during a method for producing the organic light-emitting component 10, a particle comes between a subregion 40 and/or edge region 41 of the second electrode layer 23 and the cover body 38, for example between the encapsulation layer 24 and the cover body 38, or between the second electrode layer 23 and the first electrode layer 20, for example between the first electrode layer 20 and the organic functional layer structure 22 or between the organic functional layer structure 22 and the second electrode layer 23, then for example because of internal stresses or external pressure it may be pressed through the corresponding subregion 40, or edge region 41, and the organic functional layer structure 22 as far as the first electrode layer 20 and cause a short circuit between the corresponding subregion 40, or edge region 41, and the first electrode layer 20. Because of the short circuit, heat can be formed in the corresponding OLED element, which may lead to full or partial melting of the connecting elements 48 adjacent to the corresponding OLED element and to separation and/or electrical insulation of the corresponding OLED element from the other OLED elements. This leads only to failure of the corresponding OLED element, and not to failure of the entire organic light-emitting component 10.

Figure 3:
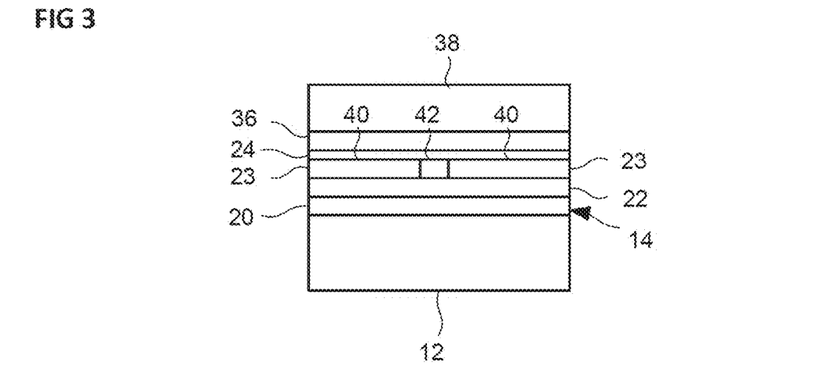
FIG. 3 shows a detailed view of the organic light-emitting component according to FIG. 2.

FIG. 3 shows a detailed view of the organic light-emitting component 10 according to FIG. 2. In particular, FIG. 3 shows a detailed view of one of the separating regions 42. The separating region 42 extends from the encapsulation layer 24 through the second electrode layer 23 as far as the organic functional layer structure 22. The separating region 42 may be empty or filled. The separating region 42 may, for example, be filled with a filler material. If the separating region 42 is empty, then the empty space of the separating region 42 has an electrically insulating effect. If the separating region 42 is filled with the filler material, then the latter has an electrically insulating effect and insulates the one of the subregions 40 from the subregion 40 neighboring it.

For example, the encapsulation material of the encapsulation layer 24 may be used as a filler material. In other words, the separating region 42 may be filled with the encapsulation material of the encapsulation layer 24. As an alternative thereto, the separating region 42 may be fully or partially filled with a different electrically insulating material, for example with an electrically insulating plastic.

The separating region 42 may, for example, be formed by a laser or by a mask method after formation of the second electrode layer 23. The width of the separating region 42 may, for example, correspond to the width of the laser cut. The separating region 42 may, for example, be filled with the encapsulation material during the formation of the encapsulation layer 24.

Figure 4:
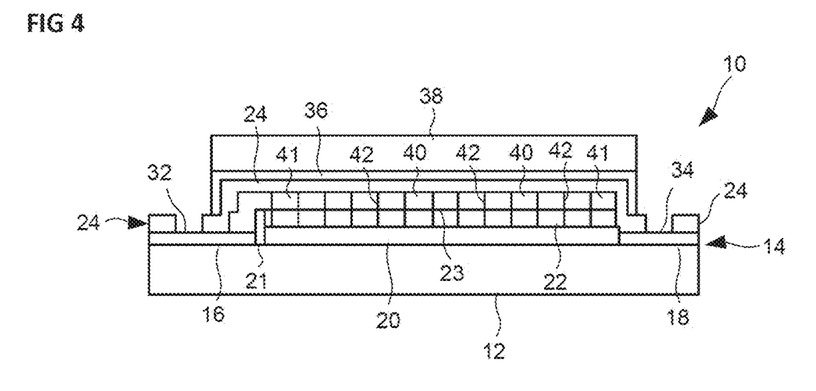
FIG. 4 shows a lateral sectional representation of an embodiment of an organic light-emitting component.

FIG. 4 shows an embodiment of an organic light-emitting component 10, which may for example correspond substantially to the organic light-emitting component 10 explained above. In the light-emitting component 10, the separating regions 42 extend through the second electrode layer 23 and the organic functional layer structure 22.

The second electrode layer 23 and the organic functional layer structure includes a plurality of subregions 40 and a plurality of edge regions 41, which are physically and electrically separated, i.e. electrically insulated, from one another in the separating regions 42, although they are electrically connected to one another by connecting elements 48 not represented in FIG. 4 (see FIGS. 7 to 10). The connecting elements 48 may be formed by the second electrode layer 23 and the organic functional layer structure 22. The subregions 40, the edge regions 41 and connecting elements 48 are therefore electrically connected to one another outside the separating regions 42 and may be formed by the second electrode layer 23 and the organic functional layer structure 22. The subregions 40 and edge regions 41 therefore form small second electrodes of the second electrode layer 23 and organic sublayers of the organic functional layer structure 22, which are electrically insulated from one another in the separating regions 42 and are electrically connected to one another by the connecting elements 48.

The edge regions 41 lie next to the subregions 40 in the lateral direction. For example, the edge regions 41 may form an edge of the subregions 40. The edge regions 41 may also be referred to as subregions lying at the edge.

The first electrode layer 14 and the subregions 40, or the edge regions 41, in particular the second electrodes and the organic sublayers, form a multiplicity of small OLED elements. For example, each subregion 40 and each edge region 41 respectively characterize an OLED element of the organic light-emitting component 10.

If, during a method for producing the organic light-emitting component 10, a particle comes between a subregion 40 and/or edge region 41 of the second electrode layer 23 and the cover body 38, for example between the encapsulation layer 24 and the cover body 38, or between the second electrode layer 23 and the first electrode layer 20, for example between the first electrode layer 20 and the organic functional layer structure 22 or between the organic functional layer structure 22 and the second electrode layer 23, then for example because of internal stresses or external pressure it may be pressed through the corresponding subregion 40, or edge region 41, and the organic functional layer structure 22 as far as the first electrode layer 20 and cause a short circuit between the corresponding subregion 40, or edge region 41, and the first electrode layer 20. Because of the short circuit, heat can be formed in the corresponding OLED element, which may lead to full or partial melting of the connecting elements 48 adjacent to the corresponding OLED element and to separation and/or electrical insulation of the corresponding OLED element from the other OLED elements. This leads only to failure of the corresponding OLED element, and not to failure of the entire organic light-emitting component 10.

Figure 5:
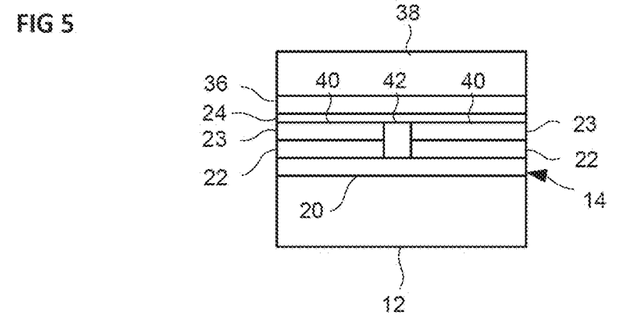
FIG. 5 shows a detailed view of an organic light-emitting component.

FIG. 5 shows a detailed view of the organic light-emitting component 10 according to FIG. 4. In particular, FIG. 5 shows a detailed view of an embodiment of one of the separating regions 42. The separating region 42 extends from the encapsulation layer 24 through the second electrode layer 23 and the organic functional layer structure 22 as far as the first electrode layer 14. The separating region 42 may be empty or filled. The separating region 42 may, for example, be filled with a filler material. If the separating region 42 is empty, then the empty space of the separating region 42 has an electrically insulating effect. If the separating region 42 is filled with the filler material, then the latter has an electrically insulating effect and insulates the one of the subregions 40 from the subregion 40 neighboring it.

For example, the encapsulation material of the encapsulation layer 24 may be used as a filler material. In other words, the separating region 42 may be filled with the encapsulation material of the encapsulation layer 24. As an alternative thereto, the separating region 42 may be fully or partially filled with a different electrically insulating material, for example with an electrically insulating plastic.

The separating region 42 may, for example, be formed by a laser or by a mask method after formation of the organic functional layer structure 22 and of the second electrode layer 23. The separating region 42 may, for example, be filled with the encapsulation material during the formation of the encapsulation layer 24.

Figure 6:
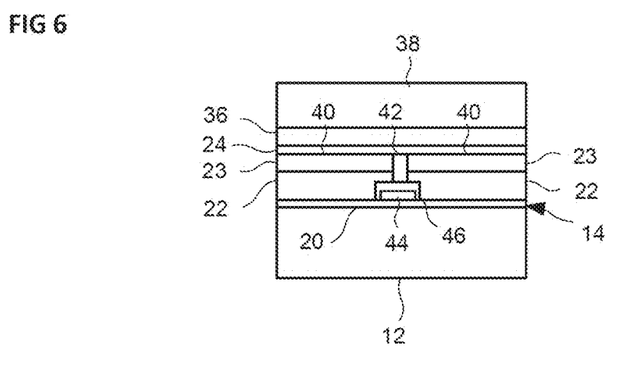
FIG. 6 shows a detailed view of an organic light-emitting component.

FIG. 6 shows a detailed view of the organic light-emitting component 10 according to FIG. 4. In particular, FIG. 6 shows a detailed view of an additional or alternative embodiment of one of the separating regions 42. A current distributor element 44 is arranged and/or formed on or over the first electrode layer 14. In addition to the current distributor element 44 shown, further current distributor elements 44 may be arranged extending over the first electrode 20. The current distributor elements 44 and the subregions 40, or edge regions 41, are configured and arranged with respect to one another in such a way that the separating regions 42 in which the subregions 40, or edge regions 41, are separated from one another are arranged vertically over the current distributor elements 44. The separating region 42 extends from the encapsulation layer 24 through the second electrode layer 23 and the organic functional layer structure 22 as far as the current distributor element 44.

The current distributor elements 44 may be interconnected with one another. In other words, the current distributor elements 44 may form a current distributor network. The current distributor elements 44 are electrically connected to the first electrode layer 14. The current distributor elements 44 may be formed in direct physical contact with the first electrode layer 14, for example directly on the first electrode layer 14.

The current distributor elements 14 may be electrically and/or physically insulated in the direction toward the organic functional layer structure 22. For example, an insulator layer 46 may be formed between the current distributor elements 44 and the organic functional layer structure 22 and/or between the current distributor elements 44 and the separating region 42. The insulator layer 46 may, for example, include or be formed from an insulating coating. The current distributor elements 44 may extend essentially in the lateral direction in the organic light-emitting component 10. The thickness of the current distributor elements 44 extends perpendicularly to the lateral direction, i.e. in a vertical direction. The current distributor elements may also be referred to as "busbars".

The current distributor elements 44 are used during operation of the organic light-emitting component 10 in order to distribute the electrical current over the first electrode layer 14, and therefore to generate a uniform light pattern over the entire luminous surface of the organic light-emitting component 10.

The separating region 42 may be empty or filled. The separating region 42 may, for example, be filled with a filler material. If the separating region 42 is empty, then the empty space of the separating region 42 has an electrically insulating effect. If the separating region 42 is filled with the filler material, then the latter has an electrically insulating effect and insulates the one of the subregions 40 from the subregion 40 neighboring it.

For example, the encapsulation material of the encapsulation layer 24 may be used as a filler material. In other words, the separating region 42 may be filled with the encapsulation material of the encapsulation layer 24. As an alternative thereto, the separating region 42 may be fully or partially filled with a different electrically insulating material, for example with an electrically insulating plastic.

The separating region 42 may, for example, be formed by a laser or by a mask method after formation of the second electrode layer 23. During the formation of the separating region 42, the insulator layer 46 and/or the current distributor elements 44 may be used as protection for the first electrode layer 14. For example, during the formation of the separating region 42, the insulator layer 46 and/or distributor elements 44 may be used as a laser stop or etch stop. The separating region 42 may, for example, be filled with the encapsulation material during the formation of the encapsulation layer 24.

Figure 7:
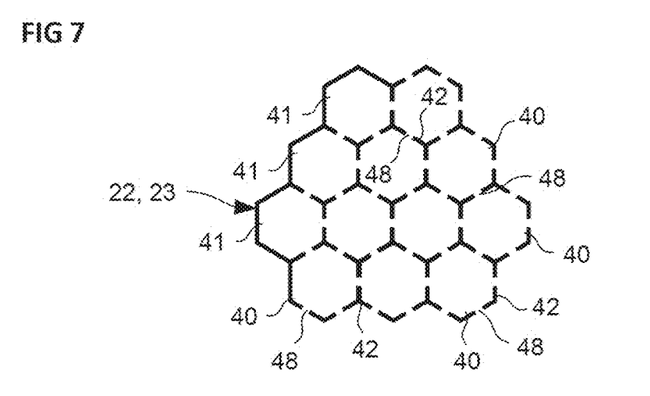
FIG. 7 shows a plan view of an embodiment of subregions of an electrode layer and/or of an organic functional layer structure.

FIG. 7 shows a plan view of an embodiment of an organic functional layer structure 22 and/or of a second electrode layer 23. The organic functional layer structure 22 and/or the second electrode layer 23 are subdivided into subregions 40 and edge regions 41. The subregions 40 and edge regions 41 are for example configured hexagonally, for example in a honeycomb fashion. The separating regions 42, in which the subregions 40 and edge regions 41 are separated from one another and electrically insulated from one another, extend between the subregions 40 and edge regions 41.

The subregions 40 and edge regions 41 are electrically and/or physically connected to neighboring subregions 40 and/or edge regions 41 by the connecting elements 48. Each subregion 40 is electrically and/or physically connected by the connecting elements 48 to six neighboring regions, which include one, two or more subregions 40 and/or one, two or more edge regions 41. Each edge region 40 is electrically and/or physically connected by the connecting elements 48 to for example from two to five neighboring regions, which include one, two or more subregions 40 and/or one, two or more edge regions 41. The connecting elements 48 are used as electrical connections and electrical fuses between the individual subregions 40 and/or edge regions 41. The electrical and physical connection between one of the subregions 40 and one of the neighboring subregions 40 or edge regions 41 is carried out by respectively one connecting element 48. In other words, one connecting element 48 is respectively arranged between one of the subregions 40 and one of the neighboring subregions 40 or edge regions 41. As an alternative thereto, the electrical and physical connection between one of the subregions 40 and one of the neighboring subregions 40 or edge regions 41 may respectively be carried out with two, three or more connecting elements 48. In other words, one connecting element 48 is respectively arranged and/or formed between one of the subregions 40 and one of the neighboring subregions 40 or edge regions 41. As an alternative thereto, two, three or more connecting elements 48 may respectively be arranged and/or formed between one of the subregions 40 and one of the neighboring subregions 40 or edge regions 41.

Each of the connecting elements 48 acts as a meltable fuse, that constitutes an overcurrent protection device that breaks the current circuit leading through the connecting element 48 by melting of the connecting element 48 when the current strength exceeds a determined value for a sufficient time. The determined value and/or the sufficient time may, for example, be adjusted through the selection of the material and/or through the width of the connecting elements 48. So long as the current strength does not exceed the determined value, the connecting element 48 acts as a current conductor between the subregions 40 and/or edge regions 41.

If the connecting elements 48 are formed by the material of the second electrode layer 23, then the value and/or the sufficient time may, for example, be adjusted through the selection of the material of the second electrode layer 23. The connecting elements 48 and/or the second electrode layer 23 may for example include or be formed from indium, lithium, copper, silver, magnesium or aluminum.

A width of one of the connecting elements 48 is less than a side length of one of the subregions 40 and/or edge regions 41. The width of the connecting element 48 extends parallel to the side of the corresponding subregion 40 or edge region 41. The side length of one of the sides of the subregions 40 and/or edge regions 41 may lie in a range of for example from 0.1 mm to 100 mm, for example from 0.5 mm to 10 mm, for example approximately 2 mm. The width of the connecting elements 48 may include a percentage of the side length, for example in a range of from 0.01% to 80%, for example from 0.1% to 20%. The width of the connecting elements 48 may lie in a range of, for example, from 0.011 mm to 0.085 mm. A length of the connecting elements 48 may, for example, correspond to a width of the separating regions 42.

In the case of a width of the separating regions 42, and therefore a length of the connecting elements 48, of for example approximately 0.05 mm, a current density of for example approximately 2.5 mA/cm$^2$, and a duration of the short circuit of for example approximately 1 s, the following materials and widths may for example be specified for the connecting elements 48:

For example, a connecting element 48 formed from indium may have a width of 0.085 mm.

For example, a connecting element 48 formed from lithium may have a width of 0.083 mm.

For example, a connecting element 48 formed from copper may have a width of 0.011 mm.

For example, a connecting element 48 formed from silver may have a width of 0.013 mm.

For example, a connecting element 48 formed from aluminum may have a width of 0.021 mm.

Figure 8:
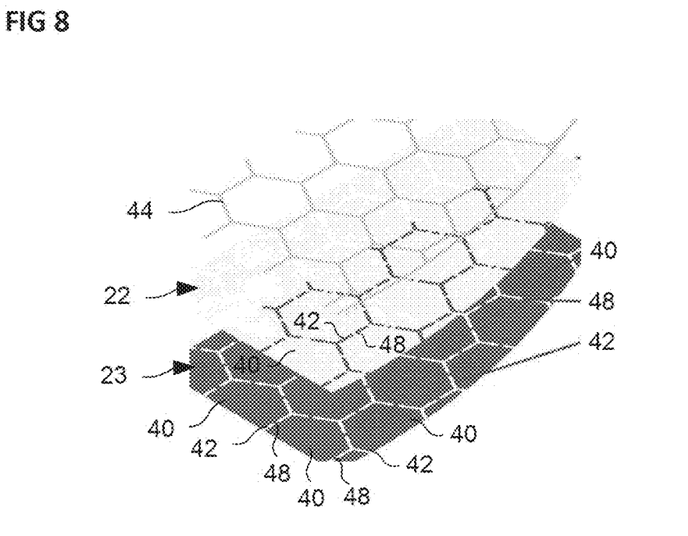
FIG. 8 shows a perspective exploded representation of an embodiment of a part of a functional layer structure.

FIG. 8 shows a perspective exploded representation of a part of a functional layer structure of the organic light-emitting component 10, in which the organic functional layer structure 22 and the second electrode layer 23 are configured according to the structure shown in FIG. 7. In particular, the subregions 40 and the edge regions 41 have a honeycomb structure. In FIG. 8, the second electrode layer 23 is arranged under the organic functional layer structure 22. A network of current distributor elements 44 is formed over the organic functional layer structure 22. The current distributor elements 44 are connected continuously to one another. The connected current distributor elements 44 and/or separating regions 42 may be configured in a honeycomb fashion. The first electrode layer 14 (not represented in FIG. 8) may be formed above the current distributor elements 44. The functional layer structure shown in FIG. 8 is therefore inverted in relation to the functional layer structures presented above.

Figure 9:
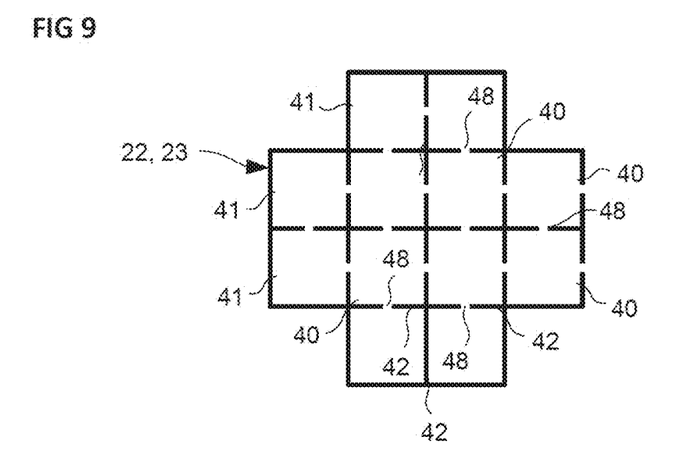
FIG. 9 shows a plan view of an embodiment of subregions of an electrode layer and/or of an organic functional layer structure.

FIG. 9 shows a plan view of an embodiment of an organic functional layer structure 22 and/or of a second electrode layer 23. The organic functional layer structure 22 and/or the second electrode layer 23 are subdivided into subregions 40 and edge regions 41. The subregions 40 and edge regions 41 are configured for example quadrilaterally, for example squarely. The separating regions 42, in which the subregions 40 and edge regions 41 are separated from one another and electrically insulated from one another, extend between the subregions 40 and edge regions 41.

The subregions 40 and edge regions 41 are electrically and/or physically connected to neighboring subregions 40 and/or edge regions 41 by the connecting elements 48. Each subregion 40 is electrically and/or physically connected by the connecting elements 48 to for example four neighboring regions, which include one, two or more subregions 40 and/or one or two edge regions 41. Each edge region 40 is electrically and/or physically connected by the connecting elements 48 to for example two or three neighboring regions, which include one, two or more subregions 40 and/or one or two edge regions 41. The connecting elements 48 are used as electrical connections and electrical fuses between the individual subregions 40 and/or edge regions 41. The connecting elements 48 may, for example, be configured according to the connecting elements 48 explained above.

Figure 10:
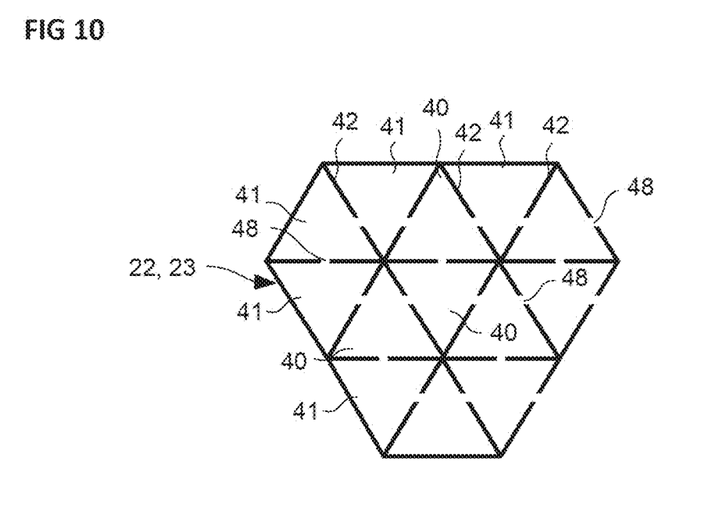
FIG. 10 shows a plan view of an embodiment of subregions of an electrode layer and/or of an organic functional layer structure.

FIG. 10 shows a plan view of an embodiment of an organic functional layer structure 22 and/or of a second electrode layer 23. The organic functional layer structure 22 and/or the second electrode layer 23 are subdivided into subregions 40 and edge regions 41. The subregions 40 and edge regions 41 are configured for example polygonally, for example triangularly. The separating regions 42, in which the subregions 40 and edge regions 41 are separated from one another and electrically insulated from one another, extend between the subregions 40 and edge regions 41.

The subregions 40 and edge regions 41 are electrically and/or physically connected to neighboring subregions 40 and/or edge regions 41 by the connecting elements 48. Each subregion 40 is electrically and/or physically connected by the connecting elements 48 to for example three neighboring regions, which for example include one, two or three subregions 40 and/or one edge region 41. Each edge region 40 is electrically and/or physically connected by the connecting elements 48 to for example two neighboring regions, which include one subregion 40 and/or one or two edge regions 41. The connecting elements 48 are used as electrical connections and electrical fuses between the individual subregions 40 and/or edge regions 41. The connecting elements 48 may, for example, be configured according to the connecting elements 48 explained above.

Figure 11:
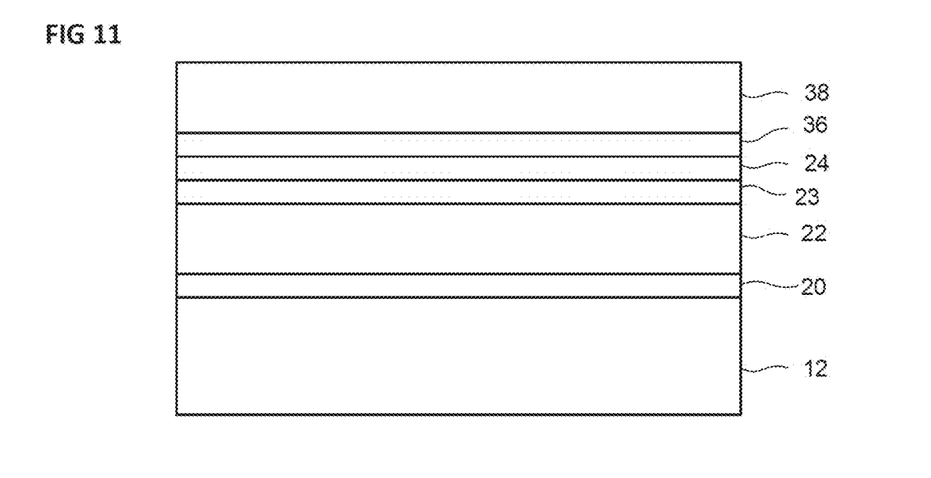
FIG. 11 shows a lateral sectional representation of an embodiment of a layer structure of an organic light-emitting component.

FIG. 11 shows a detailed sectional representation of a layer structure of an embodiment of an organic light-emitting component, for example of the organic light-emitting component 10 explained above, only one OLED element of the organic light-emitting component 10 being represented in this detailed view. For example, FIG. 11 may show a section through a central region of one of the subregions 40 away from the separating regions 42, or FIG. 11 may for example show a section through a subregion 40 and a connecting element 48.

The organic light-emitting component 10 may be configured as a top emitter and/or a bottom emitter. If the organic light-emitting component 10 is configured as a top emitter and a bottom emitter, the organic light-emitting component 10 may be referred to as an optically transparent component, for example a transparent organic light-emitting diode.

The organic light-emitting component 10 includes the carrier 12 and an active region over the carrier 12. A first barrier layer (not represented), for example a first barrier thin film, may be formed between the carrier 12 and the active region. The active region includes the first electrode 20, the organic functional layer structure 22 and the second electrode layer 23, in particular the second electrode of the OLED element. The encapsulation layer 24 is formed over the active region. The encapsulation layer 24 may be configured as a second barrier layer, for example as a second barrier thin film. The cover body 38 is arranged over the active region and optionally over the encapsulation layer 24. The cover body 38 may, for example, be arranged on the encapsulation layer 24 by a bonding layer 36.

The active region is an electrically and/or optically active region. The active region is, for example, the region of the organic light-emitting component 10 in which electrical current for operation of the organic light-emitting component 10 flows, and/or in which light is generated.

The organic functional layer structure 22 may include one, two or more functional layer structure units and one, two or more intermediate layers between the layer structure units.

The carrier 12 may be configured so as to be translucent or transparent. The carrier 12 is used as a carrier element for electronic elements or layers, for example light-emitting elements. The carrier 12 may for example include or be formed from glass, quartz and/or a semiconductor material, or any other suitable material. Furthermore, the carrier 12 may include or be formed from a plastic film or a laminate having one or more plastic films. The plastic may include one or more polyolefins. Furthermore, the plastic may include polyvinyl chloride (PVC), polystyrene (PS), polyester and/or polycarbonate (PC), polyethylene terephthalate (PET), polyether sulfone (PES) and/or polyethylene naphthalate (PEN). The carrier 12 may include or be formed from a metal, for example copper, silver, gold, platinum, iron, for example a metal compound, for example steel. The carrier 12 may be configured as a metal foil or metal-coated sheet. The carrier 12 may be a part of or form a mirror structure. The carrier 12 may include a mechanically rigid region and/or a mechanically flexible region, or be formed in such a way.

The first electrode 20 may be configured as an anode or as a cathode. The first electrode 20 may be configured so as to be translucent or transparent. The first electrode 20 includes an electrically conductive material, for example metal and/or a transparent conductive oxide (TCO) or a layer stack of a plurality of layers, which include metals or TCOs. The first electrode 20 may for example include a layer stack of a combination of a layer of a metal on a layer of a TCO, or vice versa. An example is a silver layer which is applied onto an indium tin oxide (ITO) layer (Ag on ITO), or ITO/Ag/ITO multilayers.

For example, Ag, Pt, Au, Mg, Al, Ba, In, Ca, Sm or Li as well as compounds, combinations or alloys of these materials, may be used as the metal.

Transparent conductive oxides are transparent conductive materials, for example metal oxides, for example zinc oxide, tin oxide, cadmium oxide, titanium oxide, indium oxide or indium tin oxide (ITO). Besides binary metal-oxygen compounds, for example $ZnO$, $SnO_2$, or $In_2O_3$, ternary metal-oxygen compounds, for example $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the TCO group.

As an alternative or in addition to the materials mentioned, the first electrode 20 may include: networks of metallic nanowires and nanoparticles, for example of Ag, networks of carbon nanotubes, graphene particles and graphene layers, and/or networks of semiconducting nanowires. For example, the first electrode 20 may include or be formed from one of the following structures: a network of metallic nanowires, for example of Ag, which are combined with conductive polymers, a network of carbon nanotubes which are combined with conductive polymers, and/or graphene layers and composites.

Furthermore, the first electrode 20 may include electrically conductive polymers or transition metal oxides.

The first electrode 20 may for example have a layer thickness in a range of from 10 nm to 500 nm, for example from 25 nm to 250 nm, for example from 50 nm to 100 nm.

The first electrode 20 may include a first electrical terminal, to which a first electrical potential can be applied. The first electrical potential may be provided by an energy source (not represented), for example by a current source or a voltage source. As an alternative, the first electrical potential may be applied to the carrier 12 and fed indirectly to the first electrode 20 via the carrier 12. The first electrical potential may, for example, be the ground potential or another predetermined reference potential.

The organic functional layer structure 22 may include a hole injection layer, a hole transport layer, an emitter layer, an electron transport layer and/or an electron injection layer.

The hole injection layer may be formed on or over the first electrode 20. The hole injection layer may include or be formed from one or more of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis(naphthalen-1-yl)-N,N'-bis(phenyl)-benzidine); beta-NPB N,N'-bis(naphthalen-2-yl)-N,N'-bis(phenyl)-benzidine); TPD (N,N'-bis(3-methylphenyl)-N,N'-bis(phenyl)-benzidine); spiro-TPD (N,N'-bis(3-methylphenyl)-N,N'-bis(phenyl)-benzidine); spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethyl-fluorene); DMFL-NPB (N,N'-bis(naphthalen-1-yl)-N,N'-bis(phenyl)-9,9-dimethyl-fluorene); DPFL-TPD (N,N'-bis(3-methylphenyl)-N,N'-bis(phenyl)-9,9-diphenyl-fluorene); DPFL-NPB (N,N'-bis(naphthalen-1-yl)-N,N'-bis(phenyl)-9,9-diphenyl-fluorene); spiro-TAD (2,2',7,7'-tetrakis(n,n-diphenylamino)-9,9'-spiro-bifluorene); 9,9-bis[4-(N,N-bis-biphenyl-4-yl-amino)phenyl]-9H-fluorene; 9,9-bis[4-(N,N-bis-naphthalen-2-yl-amino)phenyl]-9H-fluorene; 9,9-bis[4-(N,N'-bis-naphthalen-2-yl-N,N'-bis-phenyl-amino)-phenyl]-9H-fluorine; N,N' bis(phenanthren-9-yl)-N,N'-bis(phenyl)-benzidine; 2,7 bis[N,N-bis(9,9-spiro-bifluorene-2-yl)-amino]-9,9-spiro-bifluorene; 2,2'-bis[N,N-bis(biphenyl-4-yl)amino]9,9-spiro-bifluorene; 2,2'-bis(N,N-di-phenyl-amino)9,9-spiro-bifluorene; di-[4-(N,N-ditolyl-amino)-phenyl]cyclohexane; 2,2',7,7'-tetra(N,N-di-tolyl)amino-spiro-bifluorene; and/or N,N,N',N'-tetra-naphthalen-2-yl-benzidine.

The hole injection layer may have a layer thickness in a range of from approximately 10 nm to approximately 1000 nm, for example in a range of from approximately 30 nm to approximately 300 nm, for example in a range of from approximately 50 nm to approximately 200 nm.

The hole transport layer may be formed on or over the hole injection layer. The hole transport layer may include or be formed from one or more of the following materials: NPB (N,N'-bis(naphthalen-1-yl)-N,N'-bis(phenyl)-benzidine); beta-NPB N,N'-bis(naphthalen-2-yl)-N,N'-bis(phenyl)-benzidine); TPD (N,N'-bis(3-methylphenyl)-N,N'-bis(phenyl)-benzidine); spiro-TPD (N,N'-bis(3-methylphenyl)-N,N'-bis(phenyl)-benzidine); spiro-NPB (N,N'-bis(naphthalen-1-yl)-N,N'-bis(phenyl)-spiro); DMFL-TPD N,N'-bis(3-methylphenyl)-N,N'-bis(phenyl)-9,9-dimethyl-fluorene); DMFL-NPB (N,N'-bis(naphthalen-1-yl)-N,N'-bis(phenyl)-9,9-dimethyl-fluorene); DPFL-TPD (N,N'-bis(3-methylphenyl)-N,N'-bis(phenyl)-9,9-diphenyl-fluorene); DPFL-NPB (N,N'-bis(naphthalen-1-yl)-N,N'-bis(phenyl)-9,9-diphenyl-fluorene); spiro-TAD (2,2',7,7'-tetrakis(N,N-diphenylamino)-9,9'-spirobifluorene); 9,9-bis[4-(N,N-bis-biphenyl-4-yl-amino)phenyl]-9H-fluorene; 9,9-bis[4-(N,N-bis-naphthalen-2-yl-amino)phenyl]-9H-fluorene; 9,9-bis[4-(N,N'-bis-naphthalen-2-yl-N,N'-bis-phenyl-amino)-phenyl]-9H-fluorine; N,N'-bis(phenanthren-9-yl)-N,N'-bis(phenyl)-benzidine; 2,7-bis[N,N-bis(9,9-spiro-bifluorene-2-yl)-amino]-9,9-spiro-bifluorene; 2,2'-bis[N,N-bis(biphenyl-4-yl)amino]9,9-spiro-bifluorene; 2,2'-bis(N,N-diphenyl-amino)9,9-spiro-bifluorene; di-[4-(N,N-ditolyl-amino)-phenyl]cyclohexane; 2,2',7,7'-tetra(N,N-di-tolyl)amino-spiro-bifluorene; and N,N,N',N'-tetra-naphthalen-2-yl-benzidine.

The hole transport layer may have a layer thickness in a range of from approximately 5 nm to approximately 50 nm, for example in a range of from approximately 10 nm to approximately 30 nm, for example approximately 20 nm.

The one or more emitter layers, for example having fluorescent and/or phosphorescent emitters, may be formed on or over the hole transport layer. The emitter layer may include organic polymers, organic oligomers, organic monomers, nonpolymeric organic small molecules, or a combination of these materials. The emitter layer may include or be formed from one or more of the following materials: organic or organometallic compounds such as derivatives of polyfluorene, polythiophene and polyphenylene (for example 2- or 2,5-substituted poly-p-phenylene vinylene), as well as metal complexes, for example iridium complexes such as blue phosphorescent FIrPic (bis(3,5-difluoro-2-(2-pyridyl)phenyl-(2-carboxypyridyl)-iridium III), green phosphorescent $Ir(ppy)_3$ (tris(2-phenylpyridine)iridium III), red phosphorescent $Ru(dtb-bpy)3*2(PF_6)$ (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9, 10-bis[N,N-di-(p-tolyl)-amino]anthracene) and red fluorescent DCM2 (4-dicyanomethylene)-2-methyl-6-julolidyl-9-enyl-4H-pyrane) as nonpolymeric emitters. Such nonpolymeric emitters may, for example, be deposited by thermal evaporation. Polymer emitters may furthermore be used, which may for example be deposited by a wet chemical method, for example a spin coating method. The emitter materials may be embedded in a suitable way in a matrix material, for example a technical ceramic or a polymer, for example an epoxide, or a silicone.

The first emitter layer may have a layer thickness in a range of from approximately 5 nm to approximately 50 nm, for example in a range of from approximately 10 nm to approximately 30 nm, for example approximately 20 nm.

The emitter layer may include emitter materials emitting in one color or different colors (for example blue and yellow or blue, green and red). As an alternative, the emitter layer may include a plurality of sublayers which emit light of different colors. Mixing of the different colors may lead to the emission of light with a white color impression. As an alternative or in addition, a converter material may be arranged in the beam path of the primary emission generated by these layers, which material at least partially absorbs the primary radiation and emits secondary radiation with a different wavelength, so that a white color impression is obtained from a (not yet white) primary radiation by the combination of primary radiation and secondary radiation.

The electron transport layer may be formed, for example deposited, on or over the emitter layer. The electron transport layer may include or be formed from one or more of the following materials: NET-18; 2,2',2"-(1,3,5-benzinetriyl)-tris(1-phenyl-1-H-benzimidazole); 2-(4-biphenylyl)-5-(4-tert-butylphenyl)-1,3,4-oxadiazole-2,9-dimethyl-4,7-diphenyl-1,10-phenanthroline (BCP); 8-hydroxyquinolinolato-lithium, 4-(naphthalen-1-yl)-3,5-diphenyl-4H-1,2,4-triazole; 1,3-bis[2-(2,2'-bipyridine-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)-anthracene; 2,7-bis[2-(2,2'-bipyridine-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyl-dipyrenylphosphine oxides; naphthalenetetracarboxylic dianhydride or imides thereof; perylenetetracarboxylic dianhydride or imides thereof; and substances based on siloles having a silacyclopentadiene unit.

The electron transport layer may have a layer thickness in a range of from approximately 5 nm to approximately 50 nm, for example in a range of from approximately 10 nm to approximately 30 nm, for example approximately 20 nm.

The electron injection layer may be formed on or over the electron transport layer. The electron injection layer may include or be formed from one or more of the following materials: NDN-26, MgAg, $Cs_2CO_3$, $Cs_3PO_4$, Na, Ca, K, Mg, Cs, Li, LiF; 2,2',2''-(1,3,5-benzinetriyl)-tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato-lithium, 4-(naphthalen-1-yl)-3,5-diphenyl-4H-1,2,4-triazole; 1,3-bis[2-(2,2'-bipyridine-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)-anthracene; 2,7-bis[2-(2,2'-bipyridine-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyl-dipyrenylphosphine oxides; naphthalenetetracarboxylic dianhydride or imides thereof; perylenetetracarboxylic dianhydride or imides thereof; and substances based on siloles having a silacyclopentadiene unit.

The electron injection layer may have a layer thickness in a range of from approximately 5 nm to approximately 200 nm, for example in a range of from approximately 20 nm to approximately 50 nm, for example approximately 30 nm.

In the case of an organic functional layer structure 22 having two or more organic functional layer structure units, corresponding intermediate layers may be formed between the organic functional layer structure units. The organic functional layer structure units may respectively be configured individually per se according to one configuration of the organic functional layer structure 22 explained above. The intermediate layer may be configured as an intermediate electrode. The intermediate electrode may be electrically connected to an external voltage source. The external voltage source may, for example, provide a third electrical potential to the intermediate electrode. The intermediate electrode may also, however, not include an external electrical terminal, for example with the intermediate electrode having a floating electrical potential.

The organic functional layer structure unit may for example have a layer thickness of at most approximately 3 μm, for example a layer thickness of at most approximately 1 μm, for example a layer thickness of at most approximately 300 nm.

The organic light-emitting component 10 may optionally include further functional layers, for example arranged on or over the one or more emitter layers or on or over the electron transport layer. The further functional layers may for example be internal or external output coupling structures, which may further improve the functionality and therefore the efficiency of the organic light-emitting component 10.

The second electrode layer 23, in particular the second electrode, may be configured according to one of the configurations of the first electrode 20, in which case the first electrode 20 and the second electrode may be configured identically or differently. The second electrode may be configured as an anode or as a cathode. The second electrode may have a second electrical terminal, to which a second electrical potential can be applied. The second electrical potential may be provided by the same energy source or a different energy source to the first electrical potential. The second electrical potential may be different to the first electrical potential. The second electrical potential may, for example, have a value such that the difference from the first electrical potential has a value in a range of from approximately 1.5 V to approximately 20 V, for example a value in a range of from approximately 2.5 V to approximately 15 V, for example a value in a range of from approximately 3 V to approximately 12 V.

The encapsulation layer 24 may also be referred to as thin-film encapsulation. The encapsulation layer 24 may be configured as a translucent or transparent layer. The encapsulation layer 24 forms a barrier against chemical contaminations or atmospheric substances, in particular against water (moisture) and oxygen. In other words, the encapsulation layer 24 is configured in such a way that it cannot be penetrated, or can be penetrated at most in very small amounts, by substances that can damage the organic light-emitting component 10, for example water, oxygen or solvent. The encapsulation layer 24 may be configured as a single layer, a layer stack or a layer structure.

The encapsulation layer 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, as well as mixtures and alloys thereof.

The encapsulation layer 24 may have a layer thickness of from approximately 0.1 nm (one atomic layer) to approximately 1000 nm, for example a layer thickness of from approximately 10 nm to approximately 100 nm, for example approximately 40 nm. The encapsulation layer 24 may include a high-index material, for example one or more materials having a high refractive index, for example having a refractive index of from 1.5 to 3, for example from 1.7 to 2.5, for example from 1.8 to 2.

Optionally, the first barrier layer on the carrier 12 may be configured according to one configuration of the encapsulation layer 24.

The encapsulation layer 24 may for example be formed by a suitable deposition method, for example by an atomic layer deposition (ALD) method, for example a plasma enhanced atomic layer deposition (PEALD) method or a plasma-less atomic layer deposition (PLALD) method, or by a chemical vapor deposition (CVD) method, for example a plasma enhanced chemical vapor deposition (PECVD) method or a plasma-less chemical vapor deposition (PLCVD) method, or alternatively by other suitable deposition methods.

Optionally, an input or output coupling layer may be configured, for example, as an external film (not represented) on the carrier 12 or as an internal output coupling layer (not represented) in the layer cross section of the organic light-emitting component 10. The input/output coupling layer may include a matrix and scattering centers distributed therein, the average refractive index of the input/output coupling layer being greater than the average refractive index of the layer from which the electromagnetic radiation is provided. Furthermore, one or more antireflection layers may additionally be formed.

In the event of failure of one of the OLED elements, the output coupling layer can contribute to the light pattern of the organic light-emitting component 10 being modified only slightly and/or negligibly little.

The bonding layer 36 may for example include an adhesive and/or a coating, by which the cover body 38 is arranged, for example adhesively bonded, for example on the encapsulation layer 24. The bonding layer 36 may be configured so as to be transparent or translucent. The bonding layer 36 may, for example, include particles which scatter electromagnetic radiation, for example light-scattering particles. In this way, the bonding layer 36 can act as a scattering layer and contribute to a good hue distortion and a high output coupling efficiency.

As light-scattering particles, it is possible to provide dielectric scattering particles, for example consisting of a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$) aluminum oxide or titanium oxide. Other particles may also be suitable, so long as they have a refractive index different to the effective refractive index of the matrix of the bonding layer 36, for example air bubbles, acrylate or hollow glass spheres. Furthermore, metallic nanoparticles, metals such as gold, silver, iron nanoparticles, or the like may for example be provided as light-scattering particles.

The bonding layer 36 may have a layer thickness of more than 1 μm, for example a layer thickness of several μm. In various embodiments, the adhesive may be a lamination adhesive.

The bonding layer 36 may have a refractive index which is less than the refractive index of the cover body 38. The bonding layer 36 may for example include a low-index adhesive, for example an acrylate, which has a refractive index of approximately 1.3. The bonding layer 36 may, however, also include a high-index adhesive, which for example includes high-index nonscattering particles and has a layer thickness-averaged refractive index which corresponds approximately to the average refractive index of the organic functional layer structure 22, for example in a range of from approximately 1.6 to 2.5, for example from 1.7 to approximately 2.0.

A so-called getter layer or getter structure, i.e. a laterally structured getter layer, (not represented) may be arranged on or over the active region. The getter layer may be configured so as to be translucent, transparent or opaque. The getter layer may include or be formed from a material which absorbs and binds substances that are harmful for the active region. A getter layer may, for example, include or be formed from a zeolite derivative. The getter layer may have a layer thickness of more than 1 μm, for example a layer thickness of several μm. In various embodiments, the getter layer may include a lamination adhesive or be embedded in the bonding layer 36.

The cover body 38 may for example be formed by a glass body, a metal foil or a sealed plastic film cover body. The cover body 38 may, for example, be arranged by frit bonding (glass frit bonding/glass soldering/seal glass bonding) by a conventional glass solder in the geometrical edge regions of the organic light-emitting component 10 on the encapsulation layer 24, or the active region. The cover body 38 may, for example, have a refractive index (for example at a wavelength of 633 nm) of for example from 1.3 to 3, for example from 1.4 to 2, for example from 1.5 to 1.8.

Figure 12:
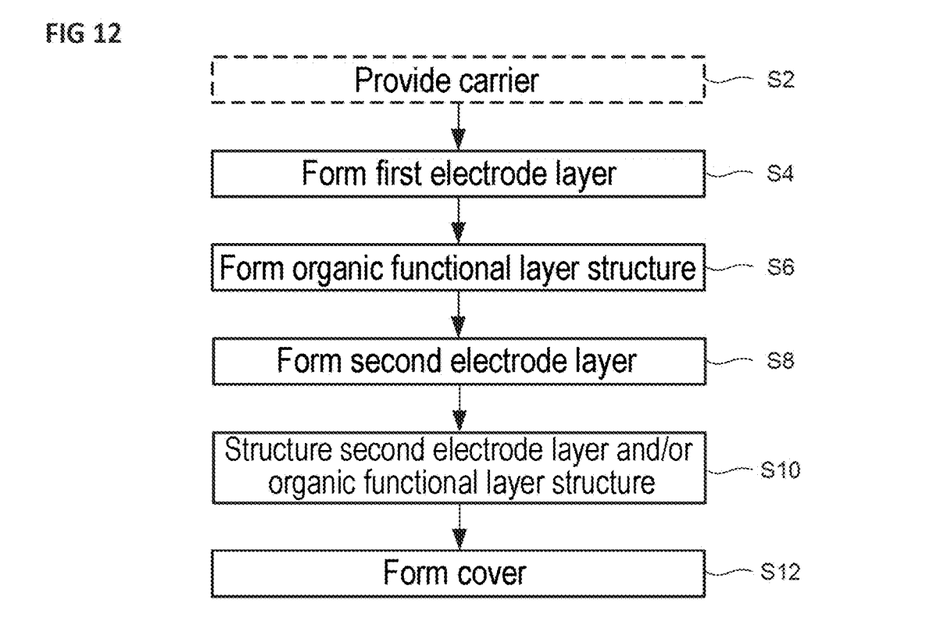
FIG. 12 shows a flowchart of an embodiment of a method for producing an organic light-emitting component.

FIG. 12 shows a flowchart of an embodiment of a method for producing an organic light-emitting component 10, for example one of the light-emitting components 10 explained above.

In a step S2, a carrier may optionally be provided. For example, the carrier 12 explained above is provided, for example formed.

In a step S4, a first electrode layer is formed. For example, the first electrode layer 14 explained above is formed, for example on or over the carrier 12. If a carrier 12 is not formed or provided, then the first electrode layer 14 may be used as a carrier element for the optoelectronic layer structure.

In a step S6, an organic functional layer structure is formed. For example, the organic functional layer structure 22 explained above is formed, for example on or over the first electrode layer 14.

In a step S8, a second electrode layer is formed. For example, the second electrode layer 23 explained above is formed, for example on or over the organic functional layer structure 22.

In a step S10, the second electrode layer 23 is structured. Optionally, the organic functional layer structure 22 may also be structured in the step S10. During the structuring of the second electrode layer 23 and/or of the organic functional layer structure 22, the separating regions 42 of the second electrode layer 23 and/or of the organic functional layer structure 22 are, for example, configured in such a way that the connecting elements 48 are formed, in which case the second electrode layer 23 and/or the organic functional layer structure 22 may be cut through in the separating regions 42 and the connecting elements 48 may be formed by unaffected regions of the second electrode layer 23 and/or of the organic functional layer structure 22.

The structuring, and therefore the formation of the separating regions, may for example be carried out by a laser, in particular by laser cutting. The laser cutting may be carried out before application of the encapsulation layer 24 through the second electrode layer 23 and/or the organic functional layer structure 22. The width of the laser cutting may for example, correspond to the width of the separating regions 42 and/or the length of the connecting elements 48. In other words, for example, the width of the separating regions 42 and/or the length of the connecting elements 48 may be predetermined by adjusting the width of the laser cutting.

If the current distributor elements 44 are formed, it may be advantageous to place the laser cutting exactly over the current distributor elements 44. The laser stops on the current distributor elements 44 or the insulator layer 46 thereover, these or this not being cut through and protecting the underlying first electrode 20 from being cut through.

As an alternative thereto, only the respectively desired layer, in particular the second electrode layer 23 and/or the organic functional layer structure 22 may be cut through and/or structured. This can be achieved by precise adjustment and dosing of the laser. This allows laser cutting outside the current distributor elements 44 without cutting through the first electrode 20.

The second electrode layer 23 may be formed from a material with a low melting point, for example indium or lithium, and the first electrode layer 14, the current distributor elements 44 and/or the insulator layer 46 may be formed by a material with a high melting point. This, in the event of a short circuit in one of the OLED elements and the melting of the corresponding connecting elements 48 caused thereby, can prevent the current distributor elements 44 and/or the insulator layer 46 from melting as well, and therefore the possibility of a short circuit being formed between the second electrode layer 23 and the current distributor elements 44.

The separating regions 42 may, for example, be configured so as to be narrower or thinner than the current distributor elements 44 (see FIG. 6). This, in the event of melting of one of the connecting elements 44, can contribute to the organic functional layer structure 22 of the neighboring OLED element not being damaged, for example short-circuited, even if the organic functional layer structure 22 has a lower melting point than the second electrode layer 23.

Optionally, a cover may be formed in a step S12. For example, a cover may be formed on or over the second electrode 23. The cover may for example include the encapsulation layer 24, the bonding layer 36 and/or the cover body 38.

The present disclosure is not restricted to the embodiments indicated. For example, the subregions 40 and/or edge regions 41 may have shapes other than those shown, for example any desired polygonal and/or round shapes. Furthermore, many more subregions 40 and/or edge regions 41 than those shown may be formed in one of the organic light-emitting components 10. Furthermore, all the organic light-emitting components 10 shown may have more than one connecting element 48, for example two, three or more, between two subregions 40 and/or edge regions 41. Furthermore, the method may include more or fewer steps. For example, additional layers, intermediate layers, scattering layers and/or output coupling layers may be formed in corresponding steps.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An organic light-emitting component, comprising:
a first electrode layer,
an organic functional layer structure over the first electrode layer,
a second electrode layer, which is formed over the organic functional layer structure and which is divided into subregions which are arranged laterally next to one another, which are respectively at least partially separated from one another, a plurality of the subregions being electrically connected to at least three neighboring subregions by at least three corresponding connecting elements which are formed by the second electrode layer, and
wherein current distributor elements are arranged over the first electrode layer and at least partially under the organic functional layer structure, and wherein the current distributor elements and the subregions are configured and arranged with respect to one another in such a way that separating regions, in which the subregions are separated from one another, are arranged vertically over the current distributor elements.

2. The organic light-emitting component as claimed in claim 1, wherein the subregions extend over the organic functional layer structure.

3. An organic light-emitting component, comprising:
a first electrode layer,
an organic functional layer structure over the first electrode layer, and
a second electrode layer over the organic functional layer structure,
wherein the second electrode layer and the organic functional layer structure are divided into subregions which are arranged laterally next to one another, which are respectively at least partially separated from one another,
wherein a plurality of the subregions are electrically connected to at least two neighboring subregions by at least two corresponding connecting elements which are formed by the second electrode layer and the organic functional layer structure, and
wherein current distributor elements are arranged over the first electrode layer and at least partially under the organic functional layer structure, and wherein the current distributor elements and the subregions are configured and arranged with respect to one another in such a way that separating regions, in which the subregions are separated from one another, are arranged vertically over the current distributor elements.

4. The organic light-emitting component as claimed in claim 3, wherein a plurality of the subregions are connected to at least three neighboring subregions by three corresponding connecting elements.

5. The organic light-emitting component as claimed in claim 3, further comprising edge regions which are formed at least by the second electrode layer and which are respectively separated at least partially from one another and from the subregions, a plurality of the subregions being electrically connected to at least one neighboring edge region and to at least one neighboring subregion by two corresponding connecting elements which are formed at least by the second electrode layer.

6. The organic light-emitting component as claimed in claim 5, wherein the subregions and/or the edge regions are configured in a honeycomb fashion.

7. A method for producing an organic light-emitting component, the method comprising:
forming a first electrode layer,
forming an organic functional layer structure over the first electrode layer, and
forming a second electrode layer over the organic functional layer structure,
wherein the second electrode layer and the organic functional layer structure are configured in such a way that they are divided into subregions which are arranged laterally next to one another, which are respectively at least partially separated from one another, and that a plurality of the subregions are electrically connected to at least two neighboring subregions by at least two corresponding connecting elements which are formed by the second electrode layer and the organic functional layer structure,
wherein current distributor elements are formed over the first electrode layer and at least partially under the organic functional layer structure, and wherein the current distributor elements and the subregions are configured and arranged with respect to one another in such a way that separating regions, in which the subregions are separated from one another, are arranged vertically over the current distributor elements.

8. The method as claimed in claim 7, wherein the second electrode layer and the organic functional layer structure are configured in such a way that a plurality of the subregions are connected to at least three neighboring subregions by three corresponding connecting elements.

9. The method as claimed in claim 7, wherein at least the second electrode layer is configured in such a way that it comprises edge regions which are respectively separated at least partially from one another, a plurality of the edge regions being electrically connected to at least one neighboring edge region and to at least one neighboring subregion by respectively at least one connecting element which is formed at least by the first electrode layer.

10. The method as claimed in claim 7, wherein the second electrode layer and/or the organic functional layer structure are initially formed surface-wide over the first electrode layer, and wherein the subregions and/or the edge regions are subsequently formed by correspondingly cutting through the second electrode layer and/or the organic functional layer structure by a laser except for the connecting elements.

11. The method as claimed in claim 10, wherein the current distributor elements are used as a laser stop.

12. A method for producing an organic light-emitting component, the method comprising:

forming a first electrode layer, forming an organic functional layer structure over the first electrode layer, forming a second electrode layer over the organic functional layer structure in such a way that the second electrode layer is divided into subregions which are arranged laterally next to one another, which are respectively at least partially separated from one another, a plurality of the subregions being electrically connected to at least three neighboring subregions by at least three corresponding connecting elements which are formed by the second electrode layer, and wherein current distributor elements are formed over the first electrode layer and at least partially under the organic functional layer structure, and wherein the current distributor elements and the subregions are configured and arranged with respect to one another in such a way that separating regions, in which the subregions are separated from one another, are arranged vertically over the current distributor elements.

13. The method as claimed in claim 12, wherein the organic functional layer structure is configured in such a way that the subregions extend over the organic functional layer structure.

* * * * *